United States Patent [19]
Gutierrez et al.
[11] 3,959,037
[45] May 25, 1976

[54] ELECTRON EMITTER AND METHOD OF FABRICATION

[75] Inventors: William A. Gutierrez; Herbert L. Wilson, both of Woodbridge, Va.

[73] Assignee: The United States of America as represented by the Secretary of the Army, Washington, D.C.

[22] Filed: Apr. 30, 1975

[21] Appl. No.: 573,290

[52] U.S. Cl. .................................. 148/171; 148/172; 148/175; 148/1.5; 148/33.5; 252/62.3 GA; 357/29; 313/95; 156/17

[51] Int. Cl.² ........................ H01L 7/36; H01L 7/38; H01L 7/54

[58] Field of Search .................... 148/171, 172, 33.5, 148/175, 1.5; 252/62.3 GA; 357/29; 313/95; 156/17

[56] References Cited

UNITED STATES PATENTS

| | | | |
|---|---|---|---|
| 3,478,213 | 11/1969 | Simon et al. | 313/95 X |
| 3,672,992 | 6/1972 | Schaefer | 148/171 X |
| 3,762,968 | 10/1973 | Kressel et al. | 148/171 |
| 3,862,859 | 1/1975 | Ettenberg et al. | 148/171 |
| 3,901,744 | 8/1975 | Bolger et al. | 148/171 |
| 3,901,745 | 8/1975 | Pion | 148/171 |
| 3,914,136 | 10/1975 | Kressel | 148/171 |

*Primary Examiner*—G. Ozaki
*Attorney, Agent, or Firm*—Nathan Edelberg; Milton W. Lee; Robert P. Gibson

[57] ABSTRACT

Transmission mode negative electron affinity gallium arsenide (GaAs) photocathodes and dynodes with a technique for the fabrication thereof, utilizing multi-layers of GaAs and gallium aluminum arsenide (GaAlAs) wherein the GaAs layers serve as the emitting layer and as an intermediate construction layer, and the GaAlAs layers serve as a passivating window and as an etch stop layer.

4 Claims, 1 Drawing Figure

STEP 1
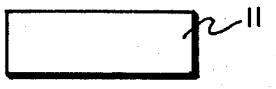
STEP 2
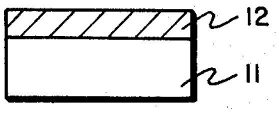
STEP 3
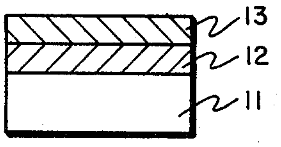
STEP 4
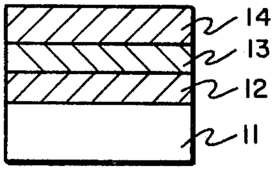
STEP 5
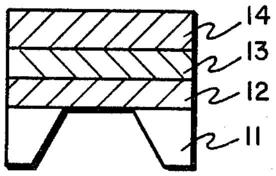
STEP 6
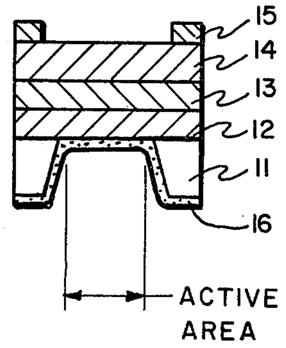
STEP 7
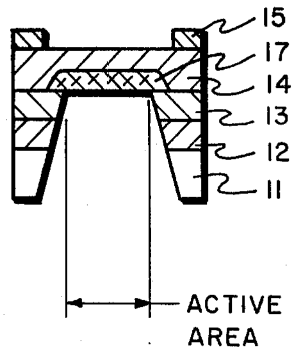

ELECTRON EMITTER AND METHOD OF FABRICATION

The invention described herein may be manufactured, used, and licensed by or for the Government for governmental purposes without the payment to us of any royalty thereon.

BACKGROUND OF INVENTION

This invention disclosure relates to electron emitters and more specifically to transmission mode negative electron affinity photocathodes and dynodes (secondary emissive devices). Photocathodes convert impinging radiation into a corresponding electron image whereas secondary emissive devices provide electron multiplication. Due primarily to the fragile nature of transmission mode negative electron affinity photocathodes and dynodes and the difficulty encountered in the fabrication thereof, commercial applicability and acceptability has been slow in materializing.

Electron emitting components, based on the negative electron affinity effect in cesium-oxygen treated single crystal semiconductor surfaces, have significantly better performance than conventional emitters in terms of sensitivity and resolution primarily due to their longer escape depths, higher escape probabilities, and narrower exit energy distributions. For a large number of pick-up tube applications (i.e., photomultipliers, television camera tubes, image intensifiers, etc.) transmission mode operation is required because this mode of operation greatly simplifies both the light and electron optics, thereby resulting in smaller and less expensive tubes.

SUMMARY OF THE INVENTION

This invention relates to a method of constructing high performance transmission mode GaAs photocathodes and dynodes wherein GaAlAs is used as a passivating window support layer and as an etch stop layer. The advantage of using GaAlAs in the construction of GaAs electron emitters lies in the fact that the lattice parameter and thermal expansion coefficient of the two materials match very closely. In multilayer structures, such as those described in this invention, this matched condition reduces the dislocations and strains in the bulk of the layers as well as at their interfaces, leading to improved crystalline quality and enhanced device performance. In addition, the difference in the etching behavior, optical transmission, and energy bandgap between GaAs and GaAlAs enables preferential etching and passivation to be performed, thus significantly facilitating device construction.

IN THE DRAWING

The single FIGURE shows the several steps envisioned in alternatively fabricating a photocathode and dynode with steps 1 through 6, inclusive, disclosing one procedure for fabricating a photocathode and step 7 disclosing a further refinement of the process resulting in a wide band photocathode and dynode.

DETAILED DESCRIPTION

The various steps in the fabrication of a transmission mode photocathode and of a dynode as envisioned herein can best be understood by reference to the drawing wherein like reference characters designate like or corresponding layers of material throughout the several views.

The following procedure describes a method for constructing a high sensitivity high resolution GaAs transmission mode photocathode. With a few additional processing steps, an improved transmission mode dynode can be constructed which will function as a broadband transmissive photocathode, as well as a secondary emissive device. The fabrication process is described with the aid of the several defined steps of the single FIGURE.

In step 1 a (100) oriented p-doped GaAs seed crystal 11 approximately 15 mils thick and 18 – 25 mm in diameter, is prepared for epitaxial growth by chemically polishing the growth surface in a $\mathbf{5H_2SO_4:1H_2O_2:1H_2O}$ etch to remove any residual mechanical damage introduced by previous mechanical lapping and polishing steps.

In step 2 a $Ga_xAl_{1-x}As$ ($0.3 \leq x \leq 0.7$) each stop layer 12, doped n-type in the range $0.5 - 5 \times 10^{17}$ $cm^{-3}$ with tellurium or selenium, is epitaxially grown on one surface of layer 11 to a thickness greater than 50 microns. Layer 12 can be grown by liquid phase technique or open tube vapor phase technique using organometallic reagents. In step 3 a $Ga_yAl_{1-y}As$ ($0.3 \leq y \leq 0.7$) p-doped ($5 \times 10^{17} cm^{-3}$) passivating window layer 13 is epitaxially grown on etch stop layer 12 using growth techniques similar to those used to grow layer 12. In step 4 a 1 – 2 micron thick p-doped (approx. $5 \times 10^{18}$ $cm^{-3}$) GaAs emitter layer 14 is epitaxially grown on layer 13 by either liquid or vapor phase technique. In the case where layer 13 is not grown smooth, it can be polished and etched to produce a planar specular surface before layer 14 is grown on it. In step 5 seed crystal 11 is selectively removed from the active region by preferentially etching away layer 11 from layer 12 in a 0.2M KOH solution by electrochemical process leaving a peripheral ring of layer 11 for mechanical support. This electrochemical etch process preferentially removes p-type GaAs from lightly n-type GaAlAs. Ohmic contact 15 and a suitable antireflection coating 16 are then applied to complete the photocathode structure as shown in the diagram of step 6. The antireflection coating may be applied by any well known technique, such as by chemical vapor deposition, RF sputtering or vacuum evaporation and should be applied to a thickness of approximately 1000 Angstroms. Several materials would be suitable, such as silicon dioxide, silicon nitride or multilayer compositions thereof. The ohmic contact 15 is applied to a thickness of approximately 500 Angstroms by either evaporation or sputtering to the periphery of layer 14 such that electrical connections can be made to the photocathode structure.

To form the dynode structure, layer 14 is made self-standing by preferentially etching layers 12 and 13 away from layer 14 in the active region with concentrated HCl as shown in step 7. A highly p-doped (approx. $5 \times 10^{18} cm^{-3}$) skin 17 is then ion implanted by standard techniques into the input side of the d dynode to a depth of approximately 1000 Angstroms to complete the structure as seen in step 7. The ion implantation effectively minimizes the back surface recombination velocity and improves device performance.

When the photocathode and/or dynode is constructed according to the process described above and the GaAs emitting layer is activated to a state of negative electron affinity by heat cleaning in vacuum and applying, by well known techniques, monolayer amounts of cesium and oxygen, both components exhibit highly improved performance over conventional photocathodes and dynodes. The dynode structure can also be used as a broadband photocathode since it does not have the filtering characteristics of the GaAlAs window layer. When the dynode is used as a photocathode, layer 17 functions as the light incident side of the device with the opposite surface becoming the electron emitting side.

While certain preferred embodiments and processes have been disclosed, it will be apparent to those skilled in the art that variations in specific details which have been described and illustrated may be resorted to without departing from the spirit and scope of the invention as defined in the appended claims.

We claim:

1. A method of fabricating a transmission mode gallium arsenide electron emitter comprising the steps of:

preparing a p-doped gallium arsenide seed crystal for epitaxial growth;

epitaxially growing an n-doped gallium aluminum arsenide etch stop layer onto the gallium arsenide prepared crystal;

epitaxially growing a p-doped gallium aluminum arsenide passivating window layer onto said etch stop layer;

epitaxially growing a p-doped gallium arsenide emitting layer onto said passivating window layer;

preferentially etching away the gallium arsenide seed crystal from the etch stop layer in a desired active region while leaving a mechanical support ring around the periphery of the device; and applying ohmic contact means to the emitter layer for effecting a photocathode structure.

2. The photocathode resulting from the practice of the fabrication technique of claim 1.

3. The method of claim 1 wherein the seed crystal, the etch stop layer and the passivating window are all preferentially etched to provide a desired active region on one surface of the emitter layer while leaving a plural layered mechanical support ring around the periphery of the emitter layer; and ion implanting the desired active region of the emitter layer for effecting the minimization of backsurface recombination velocity;

whereby the responsive bandwidth of the photocathode is broadened.

4. The photocathode resulting from the practice of the fabrication technique of claim 3.

* * * * *